(12) United States Patent
Chiu

(10) Patent No.: US 7,944,310 B2
(45) Date of Patent: May 17, 2011

(54) ACTIVE BALUN CIRCUIT

(75) Inventor: Ying-Chung Chiu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 41 days.

(21) Appl. No.: 12/472,388

(22) Filed: May 27, 2009

(65) Prior Publication Data

US 2010/0052808 A1 Mar. 4, 2010

(30) Foreign Application Priority Data

Sep. 3, 2008 (TW) .............................. 97133802 A

(51) Int. Cl.
*H03F 3/04* (2006.01)
(52) U.S. Cl. ........................................ 330/301; 333/25
(58) Field of Classification Search ................ 330/301, 330/253; 333/25, 26
See application file for complete search history.

(56) References Cited

U.S. PATENT DOCUMENTS

| 6,121,809 A * | 9/2000 | Ma et al. ..................... 327/246 |
| 6,566,961 B2 | 5/2003 | Dasgupta et al. |
| 7,688,146 B2 * | 3/2010 | Kao et al. ..................... 330/301 |
| 7,705,677 B2 * | 4/2010 | Forbes et al. ................ 330/253 |

OTHER PUBLICATIONS

Guang, Zhang, "CMOS Front-End Amplifier for Broadband DTV Tuner," Texas A&M University, May 2005.

* cited by examiner

*Primary Examiner*—Hieu P Nguyen
(74) *Attorney, Agent, or Firm*—Jianq Chyun IP Office

(57) ABSTRACT

An active balun circuit is provided, which includes an input end, a first and a second output ends, a first and a second transistors, a feedback capacitor, and a current source. The input end receives an input signal. A drain of the first transistor is coupled to the second output end, and a gate of the first transistor is coupled to the input end. A gate of the second transistor is coupled to a ground end, and a drain of the second transistor is coupled to the first output end. The feedback capacitor is coupled between the second output end and the gate of the second transistor. One end of the current source is coupled to sources of the first and second transistors, and the other end of the current source is coupled to the ground end.

9 Claims, 6 Drawing Sheets

30

| | Conventional active balun circuit | Active balun circuit 30 |
|---|---|---|
| Gain | 9.3dB | 9.1dB |
| 3dB bandwidth | 2.1GHz | 1.69GHz |
| Maximum phase difference (the frequency of the input signal is from 10 MHz to 1 GHz) | 17 degrees | 1.1 degrees |
| Maximum gain difference (the frequency of the input signal is 1 GHz) | 1.6dB | 0.1dB |
| P1dB (the frequency of the input signal is 500 MHz) | 0.756dBm | 0.988dBm |

ACTIVE BALUN CIRCUIT

CROSS-REFERENCE TO RELATED APPLICATION

This application claims the priority benefit of Taiwan application serial no. 97133802, filed on Sep. 3, 2008. The entirety of the above-mentioned patent application is hereby incorporated by reference herein and made a part of specification.

BACKGROUND OF THE INVENTION

1. Field of the Invention

The present invention generally relates to an active balun circuit, in particular, to an active balun circuit with a high frequency and a high linearity used in a complementary metal oxide semiconductor (CMOS) technology.

2. Description of Related Art

An active balun circuit is used to generate two output signals, which have the same intensity, but have a phase difference of 180 degrees. In addition, the active balun circuit is mainly applied in a radio frequency (RF) receiver.

Theoretically, a conventional active balun circuit can generate two output signals that have the same intensity but have a phase difference of 180 degrees. However, in practice, when operating at a high frequency, the conventional active balun circuit may not be able to generate two signals that have the same intensity but have a phase difference of 180 degrees for the RF receiver. Therefore, such undesirable feature may cause a serious impact on the waveforms generated by a mixer in the RF receiver, for example, the mirror image is not completely eliminated, or the isolation is poor.

FIG. 1 is a circuit diagram of a conventional active balun circuit 10. Referring to FIG. 1, the conventional active balun circuit 10 includes transistors M1 and M2, a current source CS1, capacitors C1 and C2, resistors R1 and R2, an input end INPUT1, and output ends OUTPUTP1 and OUTPUTN1. The capacitor C1 is coupled between the input end INPUT1 and a gate of the transistor M1, and the capacitor C2 is coupled between a gate of the transistor M2 and a ground end GND. The resistor R1 is coupled between a voltage supply end VDD and the output end OUTPUTN1, and the resistor R2 is coupled between the voltage supply end VDD and the output end OUTPUTP1. The output ends OUTPUTN1 and OUTPUTP1 are coupled to drains of the transistors M1 and M2 respectively. The current source CS1 is coupled between sources of the transistors M1 and M2 and the ground end GND.

The input end INPUT1 receives an input signal. The dotted line S1 shows a path in which an output signal is generated at the output end OUTPUTN1 by the input signal after passing through the transistor M1, and the dotted line S2 shows a path in which an output signal is generated at the output end OUTPUTP1 by the input signal after passing through the transistor M2. Generally, in order to improve the linearity of the conventional active balun circuit 10, the transistors M1 and M2 are often designed into small transistors, and the biases on the transistors M1 and M2 are often designed at a low level.

Though the above design improves the linearity of the conventional active balun circuit 10, when operating at a high frequency, the conventional active balun circuit 10 may generate a phase difference deviated from 180 degrees between the output ends OUTPUTN1 and OUTPUTP1. To put it simply, the conventional active balun circuit 10 cannot achieve optimal linearity, bandwidth, and phase difference features at the same time.

To solve the above problem, U.S. Pat. No. 6,566,961 provides an active balun circuit, which uses two stages of amplifier circuits to solve the above problem. The amplifier circuit in the first stage is a phase compensation circuit, and the amplifier circuit in the second stage is a gain compensation circuit. The gain compensation circuit uses two feedback capacitors to compensate the gain error. Though the active balun circuit of the U.S. Pat. No. 6,566,961 can effectively solve the above problem, as two stages of amplifier circuits are needed, the active balun circuit has a relatively large chip size and large power consumption.

FIG. 2 is circuit diagram of an active balun circuit 20 proposed by Chuang Zhang. The active balun circuit 20 was disclosed in the Master's Thesis entitled "*CMOS Front-End Amplifier for Broadband DTV Tuner*" published in May 2005 at Texas A&M University by Chuang Zhang.

The active balun circuit 20 includes transistors M3 and M4, a current source CS2, capacitors C3, C4, and C5, resistors R3 and R4, an input end INPUT2, and output ends OUTPUTP2 and OUTPUTN2. The input end INPUT2 receives an input signal. The capacitor C3 is coupled between the input end INPUT2 and a gate of the transistor M3, the capacitor C4 is coupled between a gate of the transistor M4 and a ground end GND, and the capacitor C5 is coupled between the output end OUTPUTP2 and the gate of the transistor M3. The resistor R3 is coupled between a voltage supply end VDD and the output end OUTPUTN2, and the resistor R4 is coupled between the voltage supply end VDD and the output end OUTPUTP2. The output ends OUTPUTN2 and OUTPUTP2 are coupled to drains of the transistors M3 and M4 respectively. The current source CS2 is coupled between sources of the transistors M3 and M4 and the ground end GND.

The active balun circuit 20 uses the feedback capacitor C5 to compensate the phase error generated at a high frequency, and makes use of the characteristics of a common gate configuration to reduce the gain error. However, though the active balun circuit 20 reduces the phase error generated at a high frequency and improves the linearity, the common gate configuration may narrow the overall operation bandwidth of the active balun circuit 20.

As described above, the active balun circuits still need to be improved. Currently, many manufacturers and researchers are still working on the development of an active balun circuit that has a high linearity and a small size, and can operate at a high frequency.

SUMMARY OF THE INVENTION

Accordingly, the present invention is directed to an active balun circuit suitable for operating at a high frequency, which has a higher linearity than a conventional active balun circuit, and maintains a phase difference between output signals at approximately 180 degrees even if operating at a frequency of 1 GHz.

An active balun circuit is provided in an exemplary example of the present invention. The active balun circuit includes an input end, a first and a second output ends, a first and a second transistors, a feedback capacitor, and a current source. The input end receives an input signal. A drain of the first transistor is coupled to the second output end, and a gate of the first transistor is coupled to the input end. A gate of the second transistor is coupled to a ground end, and a drain of the second transistor is coupled to the first output end. The feedback capacitor is coupled between the second output end and the gate of the second transistor. One end of the current source is coupled to sources of the first and second transistors, and the other end of the current source is coupled to the ground end.

An active balun circuit is provided in another exemplary example of the present invention. The active balun circuit includes an input end, a first and a second output ends, a first and a second transistors, a feedback capacitor, a current source, a first and a second capacitors, and a first and a second resistors. The input end receives an input signal. A drain of the first transistor is coupled to the second output end, and a drain of the second transistor is coupled to the first output end. The feedback capacitor is coupled between the second output end and a gate of the second transistor. One end of the current source is coupled to sources of the first and second transistors, and the other end of the current source is coupled to a ground end. The first capacitor is coupled between a gate of the first transistor and the input end, and the second capacitor is coupled between a gate of the second transistor and the ground end. The first resistor is coupled between a voltage supply end and the drain of the first transistor, and the second resistor is coupled between the voltage supply end and the drain of the second transistor.

In the active balun circuit provided in the exemplary example of the present invention, the feedback capacitor is connected to an AC ground end, so as to compensate the gain error and phase error generated when the active balun circuit operates at a high frequency. Therefore, the active balun circuit provided in the exemplary example of the present invention is suitable for operating at a high frequency, and has a higher linearity and more desirable phase difference between output signals than the conventional active balun circuits.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
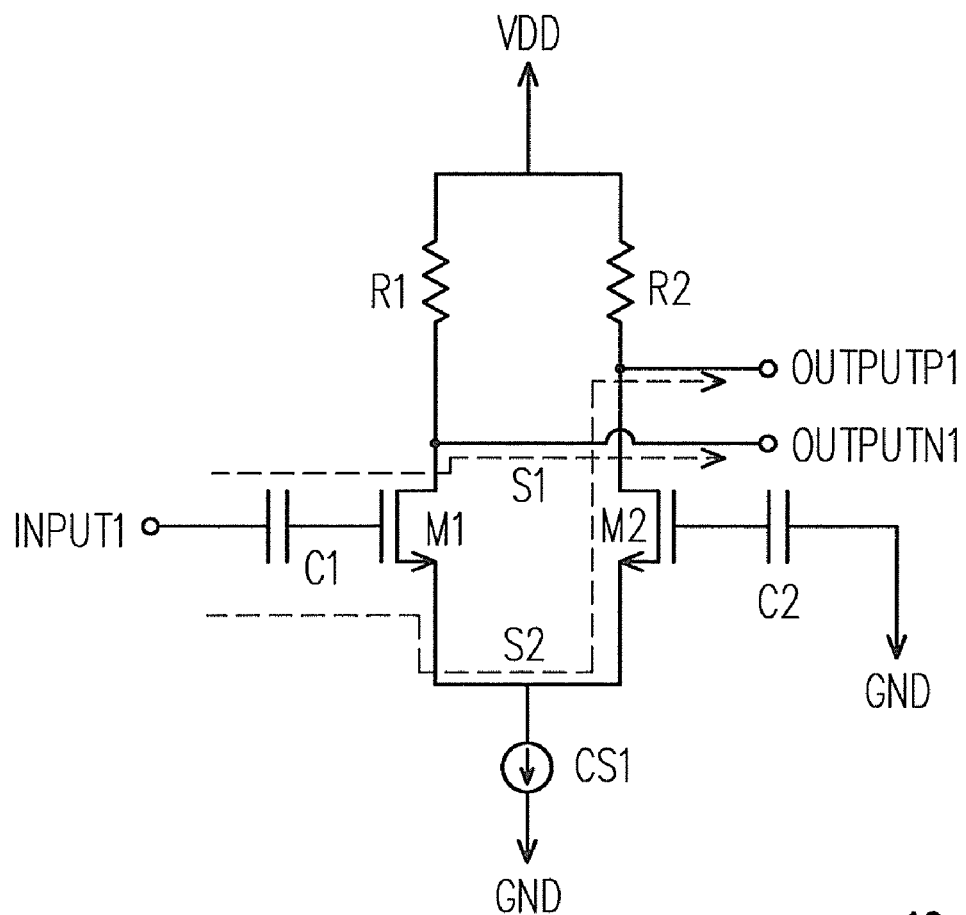
FIG. 1 is a circuit diagram of a conventional active balun circuit 10.

Reference will now be made in detail to the present embodiments of the invention, examples of which are illustrated in the accompanying drawings. Wherever possible, the same reference numbers are used in the drawings and the description to refer to the same or like parts.

Figure 3:
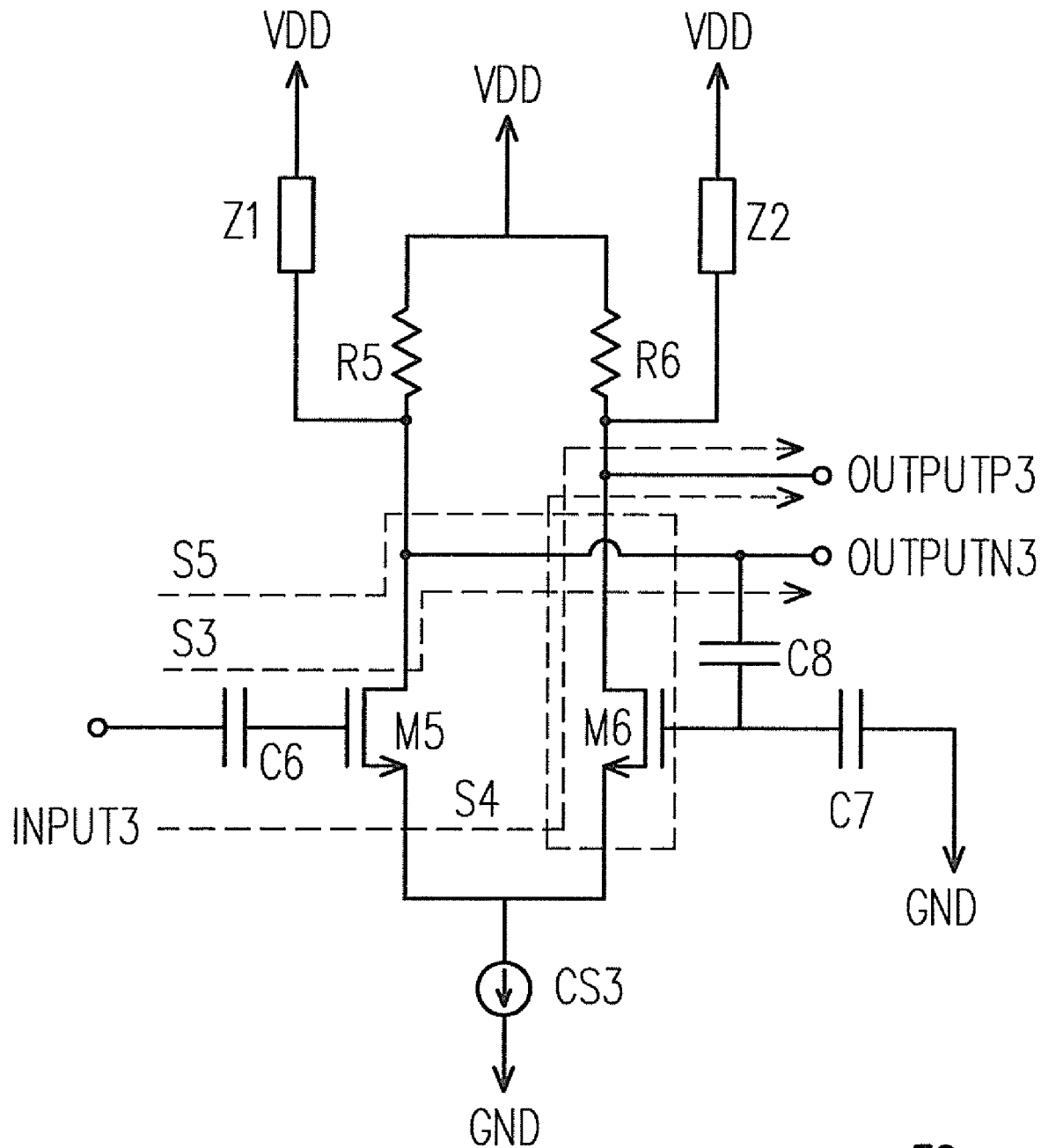
FIG. 3 is a circuit diagram of an active balun circuit 30 provided in an exemplary example of the present invention.

FIG. 3 is a circuit diagram of an active balun circuit 30 provided in an exemplary example of the present invention. Referring to FIG. 3, the active balun circuit 30 includes an input end INPUT3, output ends OUTPUTP3 and OUTPUTN3, transistors M5 and M6, resistors R5 and R6, capacitors C6, C7, and C8, and a current source CS3. The active balun circuit 30 may further include loads Z1 and Z2 coupled therewith.

The input end INPUT3 receives an input signal. The input signal is generally an AC small signal. The capacitor C6 is coupled between the input end INPUT3 and a gate of the transistor M5, and the capacitor C7 is coupled between a gate of the transistor M6 and a ground end GND. The capacitors C6 and C7 serve to isolate DC signals.

The capacitor C8 is coupled between the output end OUTPUTN3 and a gate of the transistor M8. In practice, the capacitor C8 is a feedback capacitor, which can compensate the gain error and phase error generated at a high frequency.

The resistor R5 is coupled between a voltage supply end VDD and the output end OUTPUTN3, and the resistor R6 is coupled between the voltage supply end VDD and the output end OUTPUTP3. The output ends OUTPUTN3 and OUTPUTP3 are coupled to drains of the transistors M5 and M6 respectively. The current source CS3 is coupled between sources of the transistors M5 and M6 and the ground end GND. In addition, the load Z1 is coupled between the voltage supply end VDD and the output end OUTPUTN3, and the load Z2 is coupled between the voltage supply end VDD and the output end OUTPUTP3.

Figure 2:
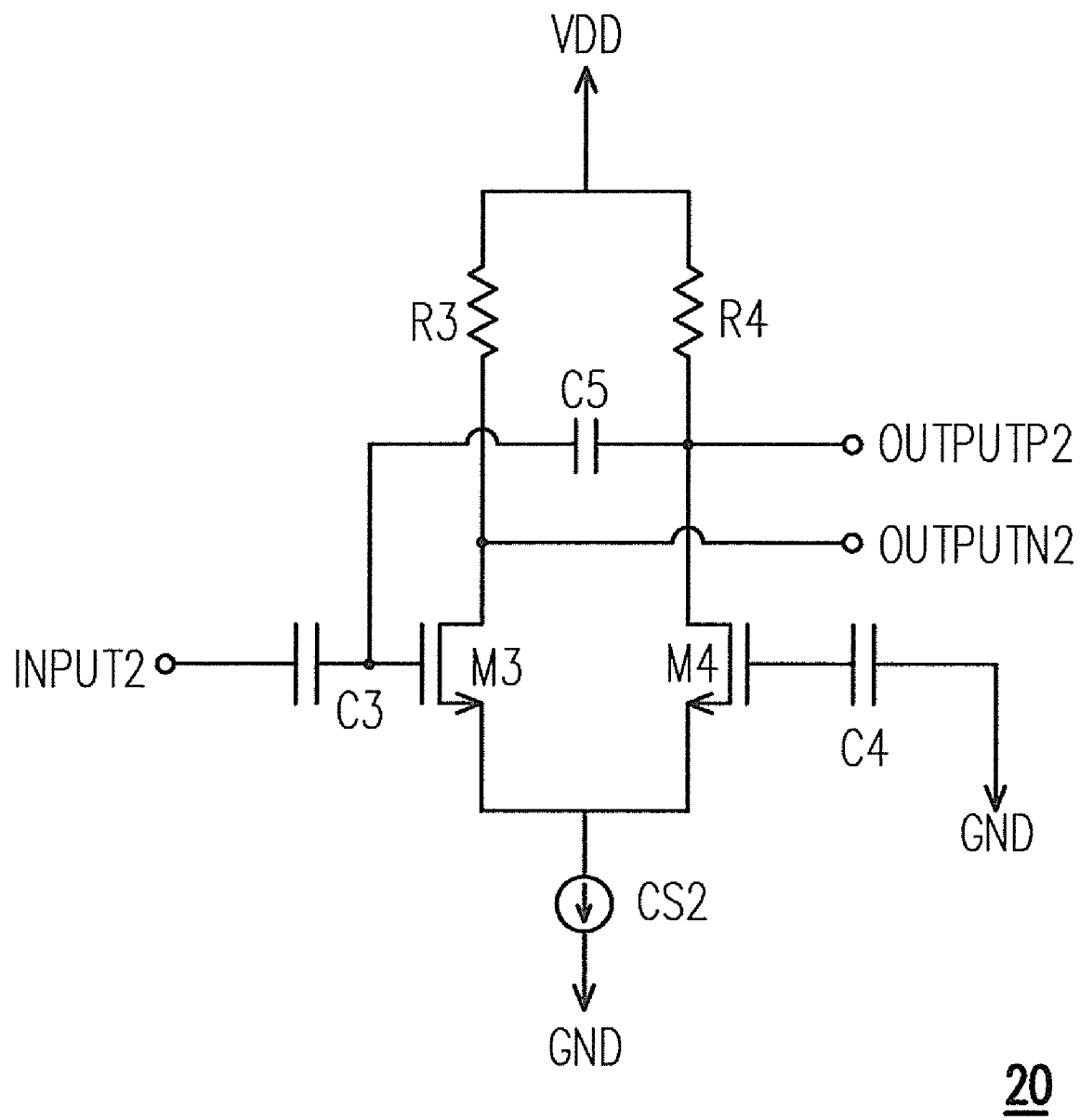
FIG. 2 is a circuit diagram of an active balun circuit 20 proposed by Chuang Zhang.

The difference between the active balun circuit 30 and the active balun circuit 20 of FIG. 2 lies in the connection of the feedback capacitor. In the active balun circuit 30, the capacitor C8 is connected to the AC ground end, so as to compensate the gain error and phase error generated when the active balun circuit operates at a high frequency.

The active balun circuit generates output signals at the output ends OUTPUTP3 and OUTPUTN3, and the signal difference at the output ends OUTPUTP3 and OUTPUTN3 is the generated differential signal. Here, the output signal at the output end OUTPUTN3 is generated by the input signal received at the input end INPUT3 after passing through the transistor M5. Therefore, the phase difference between the input signal at the input end INPUT3 and the output signal at the output end OUTPUTN3 is 180 degrees. In addition, the dotted line S3 shows a path of the input signal to reach the output end OUTPUTN3.

The output signal at the output end OUTPUTP3 is a sum of a signal generated by the input signal after passing through the transistors M5 and M6 and a signal generated by the input signal after passing through the transistor M5, the capacitor C8, and the transistor M6. In other words, there are two paths for generating the output signal at the output end OUTPUTP3, which are shown by dotted lines S4 and S5 in FIG. 3. Particularly, the dotted line S4 shows a path in which the signal is generated at the output end OUTPUTP3 by the input signal after passing through the transistors M5 and M6, and the dotted line S5 shows a path in which the signal is generated at the output end OUTPUTP3 by the input signal after passing through the transistor M5, the capacitor C8, and the transistor M6.

It should be noted that, in the dotted line S4, a signal is first generated at the output end OUTPUTN3 by the input signal after passing through the transistor M5, and then another signal is generated at the output end OUTPUTP3 by the signal generated at the output end OUTPUTN3 after passing through the capacitor C8 and the transistor M6. The signal generated at the output end OUTPUTP3 can be used to compensate the gain error and phase error generated at a high frequency. Besides, as the phase error generated at the high frequency has been compensated, the transistors M5 and M6 can be designed into smaller transistors, so as to improve the linearity of the active balun circuit 30.

In addition, in this exemplary example, the capacitors C6 and C7 and the resistors R5 and R6 may not be included in the active balun circuit 30. In other words, the input end of the active balun circuit 30 may be the gate of the transistor M5; the capacitor C6 where the input signal to be input to the gate of the transistor M5 passes through before being input may be an isolating capacitor of an input signal source itself for generating the input signal; the capacitor C7 between the gate of the transistor M6 and the ground end may be a parasitic capacitor on the circuit; and the resistors R5 and R6 are equivalent resistance generated by an external circuit coupled to the output ends OUTPUTN3 and OUTPUTP3.

Figure 4:
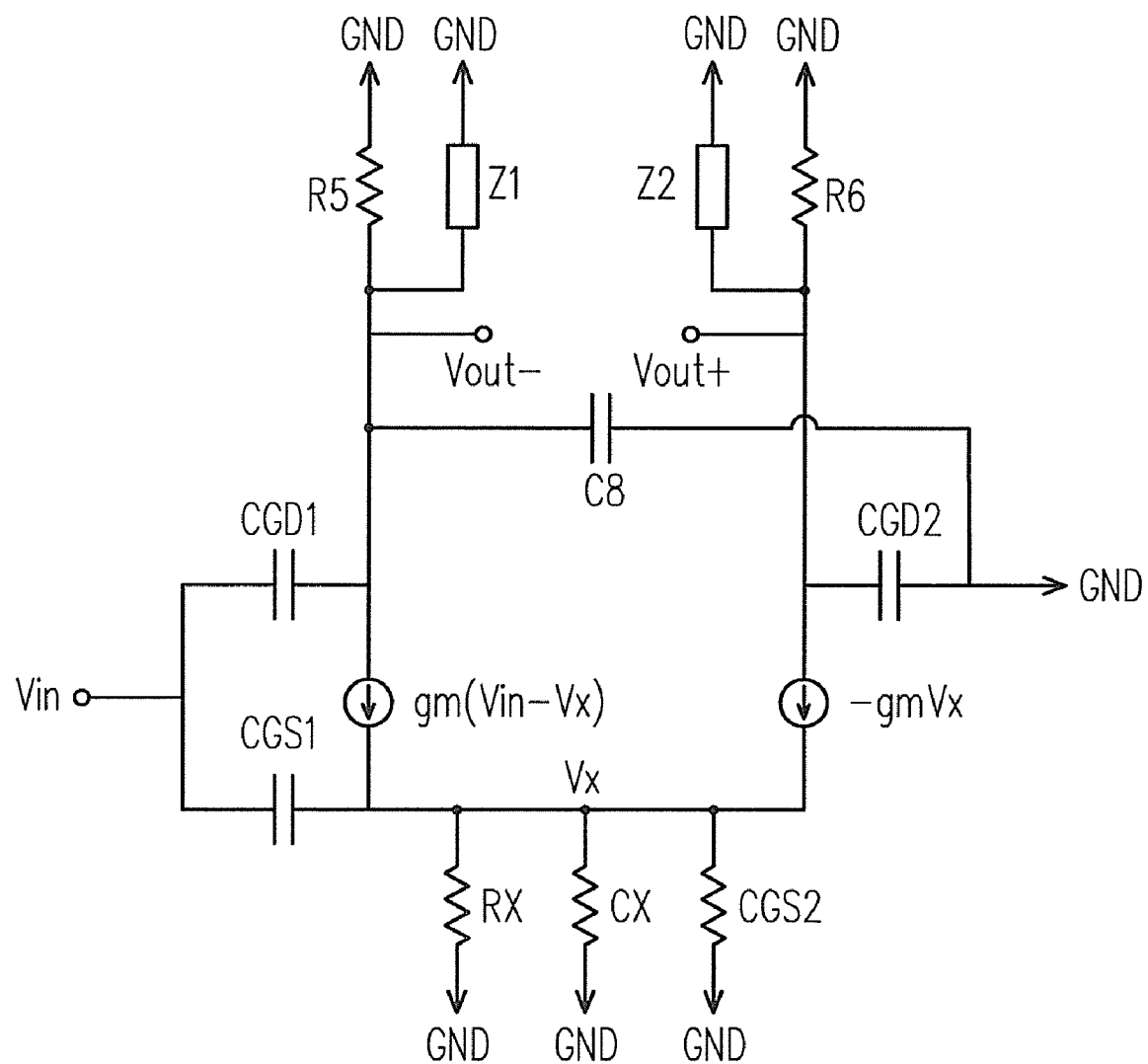
FIG. 4 is a circuit diagram of a small signal model of the active balun circuit 30 provided in the exemplary example of the present invention.

FIG. 4 is a circuit diagram of a small signal model of the active balun circuit 30 provided in the exemplary example of the present invention. In this exemplary example, it is assumed that the transistors M5 and M6 are the same transistor, that is, the trans-conductance of both the transistors M5 and M6 is $g_m$, the capacitance of equivalent capacitors CGD1 and CGD2 of the gate and drain junctions of the transistors M5 and M6 is $C_{GD}$, and the capacitance of equivalent capacitors CGS1 and CGS2 of the gate and source junctions of the transistors M5 and M6 is $C_{GS}$.

The resistance of the resistor R5 and that of the resistor R6 are both $R_L$, the impedance of the load Z1 and that of the load Z2 are both $Z_L$, and the capacitance of the capacitor C8 is $C_F$. The resistance of the parasitic resistor RX and the capacitance of the parasitic capacitor CX of sources of the transistors M5 and M6 are $R_X$ and $C_X$ respectively. The voltage of the input signal at the input end INPUT3 is $V_{in}$, the voltage at the sources of the transistors M5 and M6 is $V_x$, and the voltages of the output signals at the output ends OUTPUTN3 and OUTPUTP3 are $V_{out-}$ and $V_{out+}$ respectively.

The voltages $V_{out-}$ and $V_{out+}$ can be obtained according to the relationship diagram of the small signal model shown in FIG. 4. Here, the voltages $V_{out-}$ and $V_{out+}$ are represented as follows:

$$V_{out-} = -\frac{g_m}{2} \frac{\left(1 + s\frac{C_{GS} + C_X}{g_m}\right)}{\left(1 + s\frac{C_X + 2C_{GS}}{2g_m}\right)\left(g_L + \frac{1}{Z_L} + sC_F\right)};$$

$$V_{out+} = -\frac{g_m}{2} \frac{\left(1 + s\frac{C_{GS}}{g_m}\right)}{\left(1 + s\frac{C_X + 2C_{GS}}{2g_m}\right)\left(g_L + \frac{1}{Z_L}\right)}$$

The two output signals generated by the active balun circuit 30 have the same intensity, and have a phase difference of 180 degrees. Therefore, $V_{out+} = -V_{out-}$. Then, the capacitance $C_F$ of the capacitor C8 is calculated through derivation, which is represented as follows:

$$C_F = \left(\frac{R_L Z_L}{R_L + Z_L}\right)\frac{C_X}{g_m}$$

The capacitance $C_F$ of the capacitor C8 can be designed according to the above formula, such that the active balun circuit 30 can output two output signals having the same intensity and maintaining the phase difference of 180 degrees.

Figure 5:
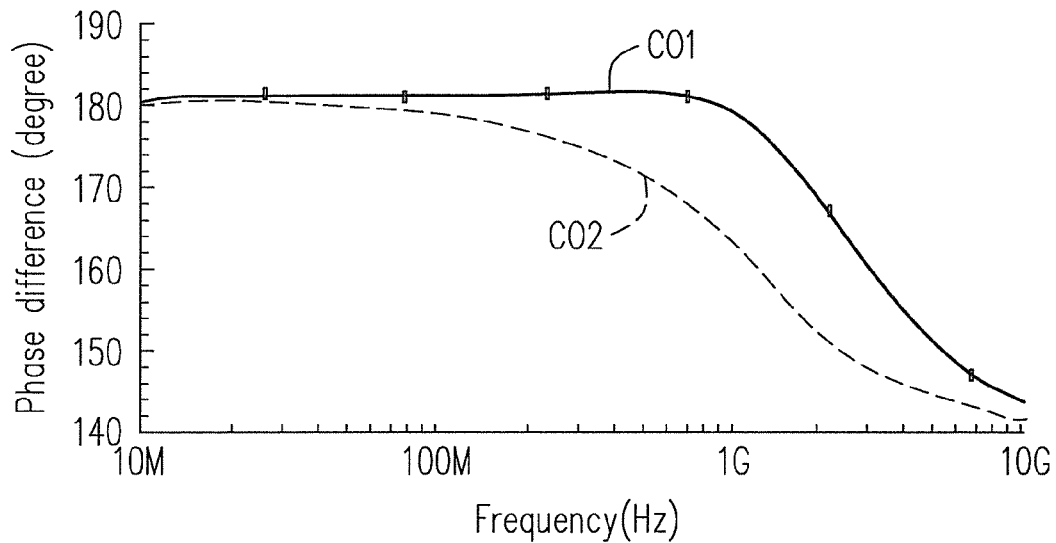
FIG. 5 is a curve diagram of a frequency of an input signal and a phase difference between output signals of the active balun circuit 30 and the conventional active balun circuit.

FIG. 5 is a curve diagram of a frequency of an input signal and a phase difference between output signals of the active balun circuit 30 and the conventional active balun circuit. Referring to FIG. 5, the curve C01 indicates the frequency of the input signal and the phase difference between the output signals of the active balun circuit 30, and the curve C02 indicates the frequency of the input signal and the phase difference between the output signals of the conventional active balun circuit. As shown in FIG. 5, the active balun circuit 30 provided in the exemplary example of the present invention is suitable for operating at a high frequency. When the frequency of the input signal is about 1 GHz, the phase difference between the output signals of the active balun circuit 30 still remains at approximately 180 degrees.

Figure 6:
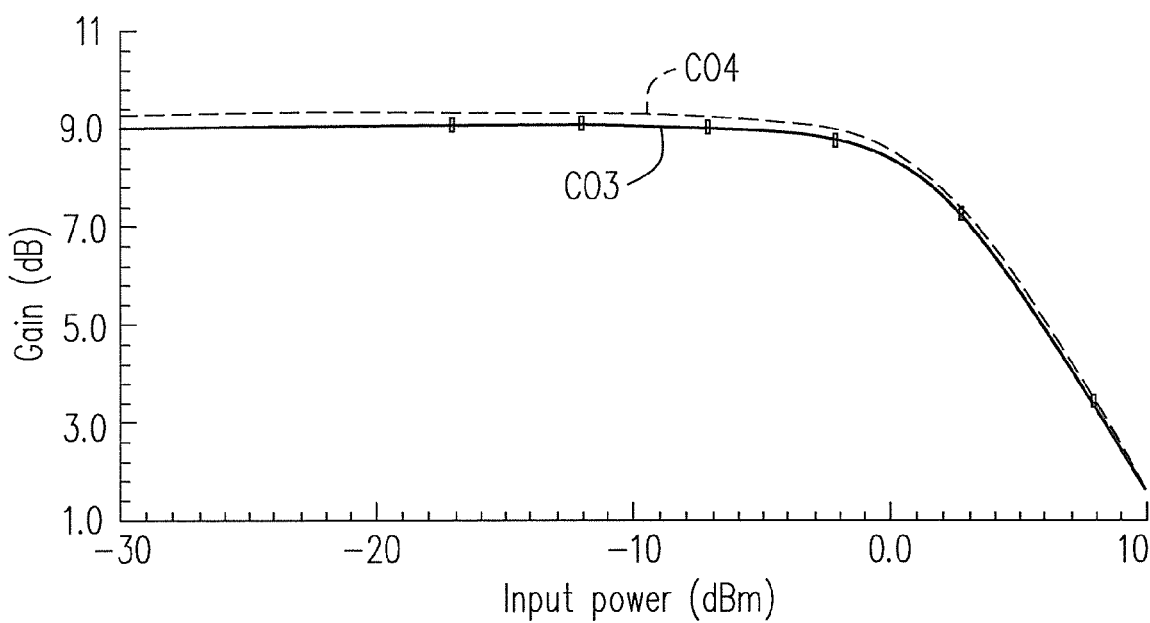
FIG. 6 is a curve diagram of a power of an input signal and a gain of output signals of the active balun circuit 30 and the conventional active balun circuit.

FIG. 6 is a curve diagram of a power of an input signal and a gain of output signals of the active balun circuit 30 and the conventional active balun circuit. Referring to FIG. 6, the curve C03 indicates the power of the input signal and the gain of the output signals of the active balun circuit 30, and the curve C04 indicates the power of the input signal and the gain of the output signals of the conventional active balun circuit. As shown in FIG. 6, the gain of the active balun circuit 30 is only slightly lower than that of the conventional active balun circuit, but the 1 dB compression point (P1 dB) of the input power of the active balun circuit 30 is greater than that of the conventional active balun circuit. The P1 dB of the conventional active balun circuit is 0.756567 dBm, whereas the P1 dB of the active balun circuit 30 is 0.988442 dBm.

Figures 7, 8:
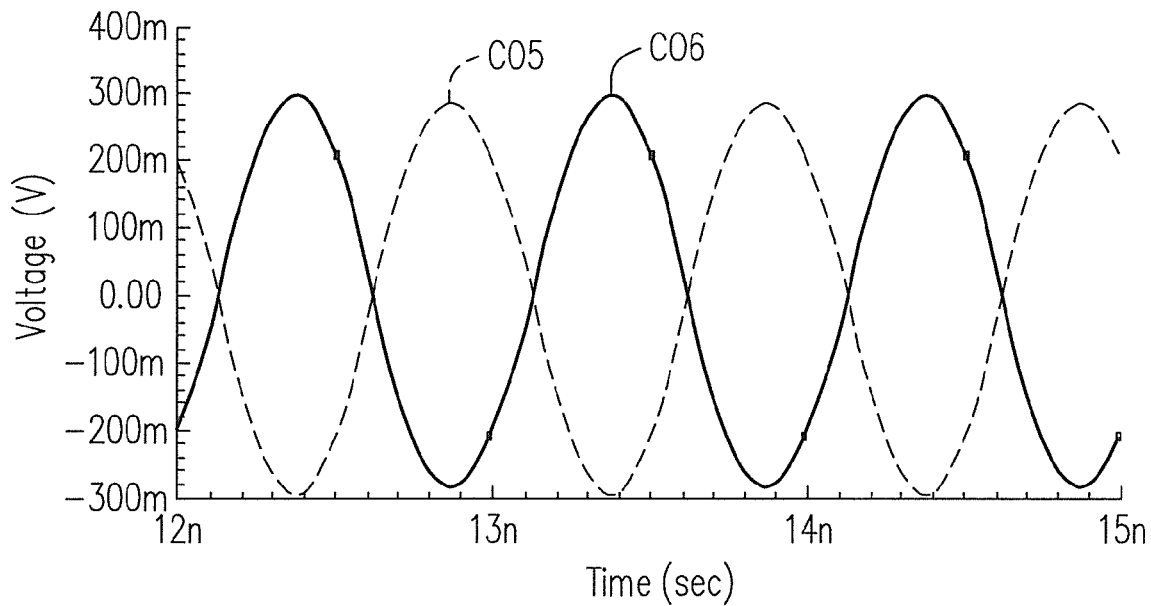
FIG. 7 is an oscillogram of output signals of the active balun circuit 30.
FIG. 8 is a comparison table between the conventional active balun circuit and the active balun circuit 30.

FIG. 7 is an oscillogram of output signals of the active balun circuit 30. Referring to FIG. 7, the curve C05 shows a waveform of the output signal at the output end OUTPUTN3, and the curve C06 shows a waveform of the output signal at the output end OUTPUTP3. As show in FIG. 7, in the active balun circuit 30, the output signals at the output ends OUTPUTN3 and OUTPUTP3 have the same intensity and the phase difference thereof is 180 degrees.

FIG. 8 is a comparison table between the conventional active balun circuit and the active balun circuit 30. As shown in FIG. 8, it is known from this table that, the gain and 3 dB bandwidth of the active balun circuit 30 are smaller than that of the conventional active balun circuit, but the linearity and phase difference of the active balun circuit 30 when operating at a high frequency are all better than that of the conventional active balun circuit.

To sum up, the active balun circuit provided in the exemplary example of the present invention is suitable for operating at a high frequency, and the linearity and phase difference of the active balun circuit 30 are both better than that of the conventional active balun circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active balun circuit, comprising:
    an input end, for receiving an input signal;
    a first output end and a second output end;
    a first transistor, comprising a drain coupled to the second output end, and a gate coupled to the input end;

a second transistor, comprising a drain coupled to the first output end, and a gate coupled to a ground end;
a feedback capacitor, coupled between the second output end and the gate of the second transistor;
a current source, comprising two ends, one end thereof is coupled to sources of the first and second transistors, and the other end thereof is coupled to the ground end; and
a first capacitor and a second capacitor, wherein the first capacitor is coupled between the gate of the first transistor and the input end, and the second capacitor is coupled between the gate of the second transistor and the ground end.

2. The active balun circuit according to claim 1, further comprising:
a first resistor and a second resistor, wherein the first resistor is coupled between a voltage supply end and the drain of the first transistor, and the second resistor is coupled between the voltage supply end and the drain of the second transistor.

3. The active balun circuit according to claim 1, wherein a voltage on the first output end is the same as that on the second output end, but a phase difference thereof is 180 degrees.

4. The active balun circuit according to claim 2, further comprising:
a first load and a second load, wherein the first load is coupled between the voltage supply end and the drain of the first transistor, and the second load is coupled between the voltage supply end and the drain of the second transistor.

5. The active balun circuit according to claim 4, wherein when a resistance of the first resistor and that of the second resistor are both $R_L$, a trans-conductance of the first transistor and that of the second transistor are both $g_m$, and an impedance of the first load and that of the second load are both $Z_L$, a capacitance of the feedback capacitor is $$C_F = \left(\frac{R_L Z_L}{R_L + Z_L}\right)\frac{C_X}{g_m},$$

wherein $C_X$ is a capacitance of a parasitic capacitor of the sources of the first and second transistors.

6. An active balun circuit, comprising:
an input end, for receiving an input signal;
a first output end and a second output end;
a first transistor, comprising a drain coupled to the second output end;
a second transistor, comprising a drain coupled to the first output end;
a feedback capacitor, coupled between the second output end and a gate of the second transistor;
a current source, comprising two ends, one end thereof is coupled to sources of the first and second transistors, and the other end thereof is coupled to a ground end;
a first capacitor and a second capacitor, wherein the first capacitor is coupled between a gate of the first transistor and the input end, and the second capacitor is coupled between the gate of the second transistor and the ground end; and
a first resistor and a second resistor, wherein the first resistor is coupled between a voltage supply end and the drain of the first transistor, and the second resistor is coupled between the voltage supply end and the drain of the second transistor.

7. The active balun circuit according to claim 6, wherein a voltage on the first output end is the same as that on the second output end, but a phase difference thereof is 180 degrees.

8. The active balun circuit according to claim 6, further comprising:
a first load and a second load, wherein the first load is coupled between the voltage supply end and the drain of the first transistor, and the second load is coupled between the voltage supply end and the drain of the second transistor.

9. The active balun circuit according to claim 8 wherein when a resistance of the first resistor and that of the second resistor are both $R_L$, a trans-conductance of the first transistor and that of the second transistor are both $g_m$, and an impedance of the first load and that of the second load are both $Z_L$, a capacitance of the feedback capacitor is $$C_F = \left(\frac{R_L Z_L}{R_L + Z_L}\right)\frac{C_X}{g_m},$$

wherein $C_X$ is a capacitance of a parasitic capacitor of the sources of the first and second transistors.

* * * * *